(12) United States Patent
Decamps et al.

(10) Patent No.: US 6,206,197 B1
(45) Date of Patent: Mar. 27, 2001

(54) SEMICONDUCTOR WAFER CARRIER WITH GROOVES

(75) Inventors: Pascal Decamps; André Rochet, both of Meylan; Daniel Gardellin, Grenoble, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/428,357

(22) Filed: Oct. 28, 1999

(30) Foreign Application Priority Data

Oct. 30, 1998 (FR) .................................................. 98 13885

(51) Int. Cl.⁷ .............................. B65D 85/30; A47G 19/08
(52) U.S. Cl. ........................ 206/711; 206/454; 211/41.18
(58) Field of Search .................................. 206/711, 725, 206/454, 334; 211/41.12, 41.17, 41.18

(56) References Cited

U.S. PATENT DOCUMENTS

| 3,486,631 | * | 12/1969 | Rodman | 206/711 |
| 4,566,839 | * | 1/1986 | Butler | 206/454 X |
| 5,429,251 | * | 7/1995 | Matthews | 211/41 |
| 5,706,946 | * | 1/1998 | Kakizaki et al. | 206/454 |
| 5,725,101 | * | 3/1998 | Kakizaki et al. | 206/711 |
| 5,749,467 | | 5/1998 | Gregerson | . |
| 5,782,361 | | 7/1998 | Kakizaki et al. | . |

FOREIGN PATENT DOCUMENTS

WO 96/11524    4/1996  (WO) .

OTHER PUBLICATIONS

French Search Report dated Aug. 31, 1999 with Annex to French Application No. 98 13885.

* cited by examiner

*Primary Examiner*—Bryon P. Gehman
(74) *Attorney, Agent, or Firm*—Theodore E. Galanthay; Stephen C. Bongini; Fleit, Kain, Gibbons, Gutman & Bongini P.L.

(57) ABSTRACT

A carrier of semiconductor wafer transportation. The carrier comprising: a base; two or more walls mounted to the base, with a plurality of grooves for receiving wafers by lateral insertion thereinto through a mouth, the mouth defined by an upper wall and a substantially horizontal lower wall, wherein the groove comprises a closed end defined by a back wall joined to the upper wall and the lower wall so that the groove narrows from the mouth towards the closed end, the upper wall being slanted upward towards the mouth and the back wall being slanted towards the mouth in the region close to the horizontal wall.

11 Claims, 3 Drawing Sheets

SEMICONDUCTOR WAFER CARRIER WITH GROOVES

CROSS-REFERENCE TO RELATED APPLICATIONS

This application is based upon and claims priority from prior French Patent Application No. 98/13885, filed Oct. 30, 1998, the entire disclosure of which is herein incorporated by reference.

BACKGROUND OF THE INVENTION

1. Field of the Invention

The present invention relates to a carrier used for the transportation of semiconductor wafers from one processing station to another.

2. Description of the Related Art

FIG. 1A shows a top view and FIG. 1B shows a front view of a conventional wafer carrier. In FIG. 1B, the carrier 10 is seen on the side of an opening through which the wafers are inserted. The carrier 10 includes a base 12 from which two vertical walls 13 extend on both sides. Walls 13 comprise horizontal grooves 15 with a trapezoidal section. Each groove 15 of one of walls 13 is in the same plane as a groove 15 of the other wall 13, so that the two grooves form a single groove for receiving a wafer (not shown).

As can be seen in FIG. 1A, walls 13 include a straight portion 7 on the side of the insertion opening and a curved portion 9 at the back, which follows the shape of the wafers and stops them. The carrier 10 is generally provided with a handle 17 forming integral with the upper surface of the carrier 10, arranged close to the insertion opening 11.

These carriers are used to carry batches of wafers, stacked vertically in the carrier 10, from one processing station to another. At each station, the wafers are loaded and unloaded one by one by means of a handling robot provided with fingers which have to slide between the wafers. For the robot to be able to properly handle the wafers, it is necessary that the wafer positions vary little with respect to corresponding reference positions. The accuracy of the wafer positioning depends on grooves 15.

FIG. 2 shows an enlarged view of a groove 15. As mentioned previously, this groove 15 conventionally forms a trapezoidal shape, the narrowest side of the trapezoid forming the bottom 17 of the groove 15. This shape enables an easy handling of the wafers with no clamping risk. The upper wall and the lower wall of the groove are slanted symmetrically with respect to the horizontal direction.

FIG. 2 also shows a same wafer 20 such as it is normally arranged at the level of straight portion 7 of the groove 15 and at the level of curved portion 9 of the groove 15 (see FIG. 1A). These two positions are designated by A and B, respectively.

The fully inserted position is position B. In this position B, the edge of the wafer 20 is generally in contact with the bottom 17 of groove 15, this being due to the fact that, during transportation, the carriers are arranged with their insertion opening 11 facing upwards and that these carriers are then handled with care when they are placed vertically, to avoid ejecting the wafers.

The load and unload position is position A. In position A, the side of the wafer 20 closest to the insertion opening 11 slants downward. This downward slanting of wafer 20 is due to the slanting of the lower wall of the groove 15. The distance between the edges of two or more stacked wafers 20 in carrier 10, in the load/unload position A is not uniform. Non-uniform distances reduce the operation range of the handling robots and increase risks of wafer damage.

To address this problem of slanting, carrier manufacturers have devised several solutions to ensure that wafers 20 are maintained more horizontally. The manufacturer, FLUOROWARE has provided wafer carriers in which the groove walls, still slanted, comprise a horizontal portion in the vicinity of the groove bottom.

This solution, however, has the disadvantage of widening the groove bottom, which decreases the axial positioning accuracy of the wafers when placed vertically. This inaccuracy is incompatible with an operation of wafer transfer to special carriers comprising, in the same volumes, twice as many wafers. Indeed, this automatic transfer operation between carriers is performed by lifting the wafers by means of a comb. If the wafers are axially mispositioned, they could be mishandled and damaged by the comb.

In another solution to address this problem of slanting, the manufacturer EMPAK has devised to form, in the bottom of the grooves 15 at the curved portion 9, humps on the slanted walls. The humps aim at pushing the rear edges of the wafers substantially to the position of the edges in straight portion 7 of the grooves 15.

This solution has the disadvantage of being difficult to manufacture. Specifically, it is difficult to form these humps with a sufficient accuracy and to ensure that the rear edges of the wafers are always pushed by the same distance, which causes wafer slanting dispersions.

Accordingly, a need exists to provide a wafer carrier that minimizes the problem of wafer slanting without these shortcomings.

SUMMARY OF THE INVENTION

An object of the present invention is to provide a wafer carrier ensuring an excellent wafer horizontality.

Another object of the present invention is to provide such a wafer carrier ensuring also an excellent axial positioning of the wafers when said wafers are vertically arranged.

To achieve these objects, the present invention provides a semiconductor wafer carrier comprising: a base; two or more walls mounted to the base, with a plurality of grooves for receiving wafers by lateral insertion there into through a mouth, the mouth defined by an upper wall and a substantially horizontal lower wall, wherein the groove comprises a closed end defined by a back wall joined to the upper wall and the lower wall so that the groove narrows from the mouth towards the closed end, the upper wall being slanted upward towards the mouth and the back wall being slanted towards the mouth in the region close to the horizontal wall.

According to an embodiment of the present invention, the lower walls of the grooves are vertically positioned so that the wafers have the same vertical position as in a conventional carrier, the grooves of which have two slanted walls.

According to an embodiment of the present invention, the groove bottoms are V-shaped.

According to an embodiment of the present invention, the lower walls of the grooves are slanted by approximately 1° with respect to the horizontal direction.

According to an embodiment of the present invention, the upper walls of the grooves are slanted by approximately 10° with respect to the horizontal direction.

According to an embodiment of the present invention, the V-shaped groove bottoms have an angle of substantially 135°.

The foregoing objects, features and advantages of the present invention, will be discussed in detail in the following non-imiting description of specific embodiments in connection with the accompanying drawings.

DETAILED DESCRIPTION OF PREFERRED EMBODIMENTS

Preferred embodiments ofthe present invention will be described in detail herein below with reference to the attached drawings.

Figure 3:
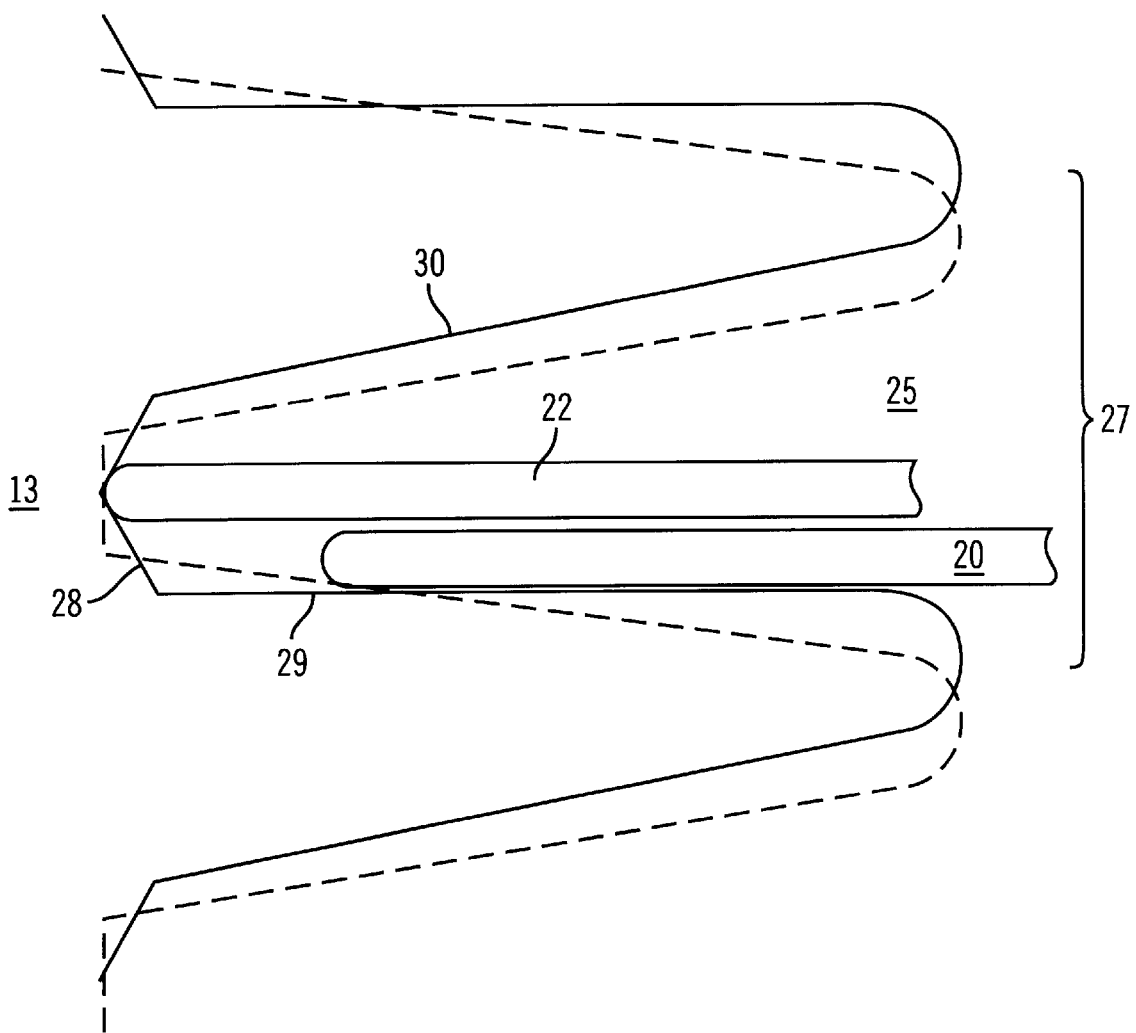
FIG. 3 shows an embodiment of a groove of a carrier according to the present invention.

In FIG. 3, a groove 25 with a mouth 27 of a wafer carrier according to the present invention includes asymmetrical walls. For convenience, the groove 15 of the prior art carrier is shown in a dashed line. According to an aspect of the present invention, the lower wall 29 is substantially horizontal, preferably very slightly slanted downwards from the groove bottom, for example, by approximately 1°. The upper wall 30 of the groove 25 is slanted to ensure a sufficient opening of the groove, necessary to facilitate wafer insertion. This upper wall is slanted upward from the groove bottom, by approximately 10°, for example.

Due to the fact that the lower wall is practically horizontal, the edge of a wafer 20 is practically at the same height, be it at the bottom of a groove or distant from the bottom. Wafer 20 thus remains horizontal.

Figure 1A:
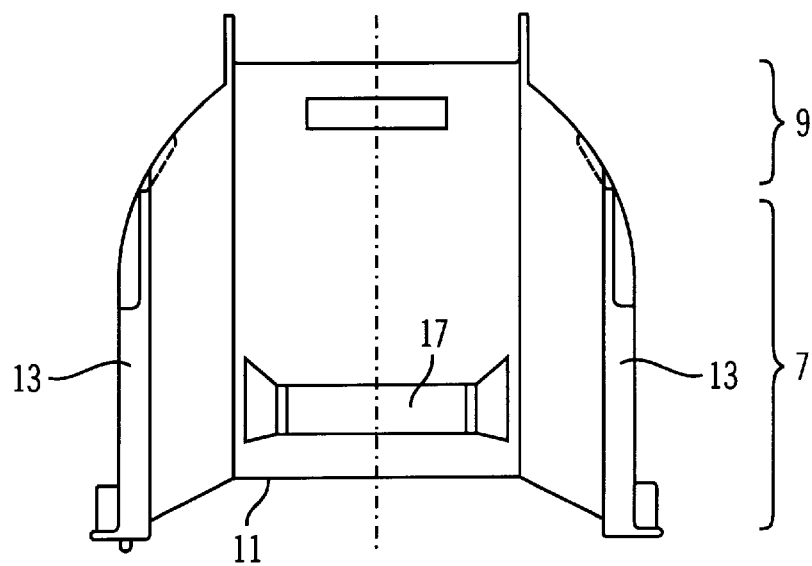
FIG. 1A is a top view and FIG. 1B is a front view of a prior art wafer carrier.
Figure 1B:
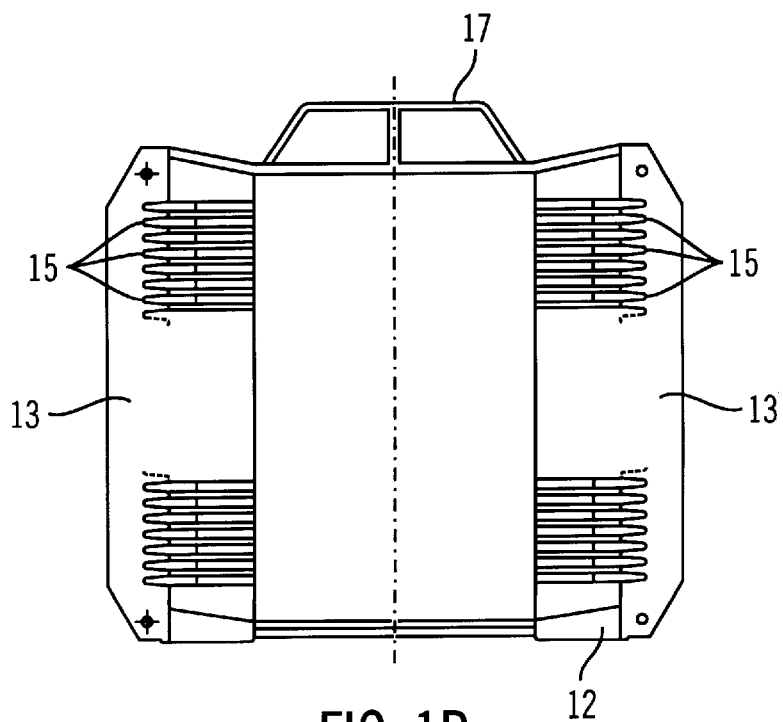
Figure 2:
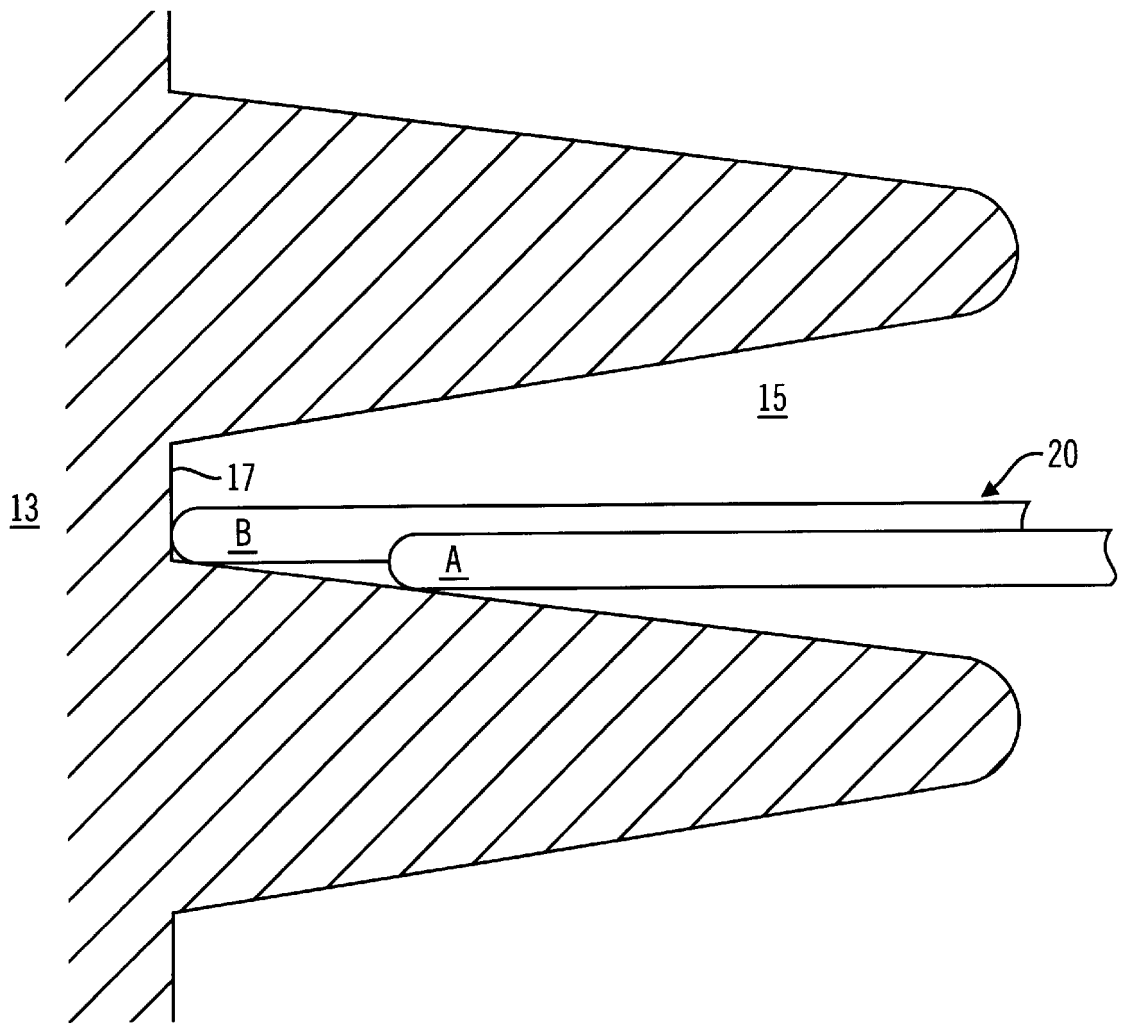
FIG. 2 shows an enlarged view of a groove of the carrier of FIGS. 1A and 1B.

It is desirable to be able to use a carrier according to the present invention to replace conventional carriers without having to modify the setting of the handling robots. It is also desirable to be able to indifferently use carriers according to the present invention and conventional carriers in a same installation. For this purpose, wafers 20 must, in a carrier according to the present invention, be at the same height as in a conventional carrier having grooves 15 of the type in FIG. 2. In other words, wafer 20 shown in FIG. 3, the edge of which is distant from the groove bottom, has to be at position A of FIG. 2. The corresponding position of the groove of FIG. 2 is shown in dashed lines in FIG. 3. The lower wall of groove 25 is at a height such that the edge of wafer 20 is at the intersection of the lower wall of groove 25, in full line, and of the lower wall of the groove shown in dotted line.

According to the mouth 27 of the groove 25 and to the slanting chosen for its upper wall 30, the groove bottom can be relatively large. To nevertheless ensure a good axial positioning of the wafers when they are vertically positioned, the back wall 28 of the groove 25 preferably has, as shown, a V-shape. This V for example has an angle of approximately 135°. Thus, when the wafers are vertically arranged, the wafers center by gravity at the bottom of the Vs, as shown for a wafer 22. In another embodiment, the back wall 28 is slanted at the area near the lower wall 29 toward the mouth 27 of the groove to provide good axial positioning.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor wafer carrier comprising:
   a base; and
   at least two vertical side walls mounted to the base, wherein each vertical side wall comprises a plurality of symmetrically formed horizontal grooves for receiving semiconductor wafers by lateral insertion thereinto through a mouth of each groove, each groove comprising:
      a lower wall with a first end and a second end at the mouth of the groove, the lower wall being substantially horizontal so that a wafer resting on the lower wall is substantially horizontal;
      an upper wall with a first end and a second end at the mouth of the groove, the upper wall slanting so the second end of the upper wall is at a greater distance from the lower wall than the first end of the upper wall; and
      a back wall having upper and lower members that form a V-shape,
      wherein the lower member of the back wall is a straight member with a first end and a second end that joins the first end of the lower wall, and
      the upper member of the back wall is a straight member with a first end that joins the first end of the lower member of the back wall and a second end that joins the first end of the upper wall.

2. The wafer carrier of claim 1, wherein the lower walls are formed at a spacing in the vertical walls so as to hold a wafer inserted thereinto at a vertical height substantially similar to the vertical height of a semiconductor wafer carrier using a lower wall which is not substantially horizontal.

3. The wafer carrier of claim 1, wherein the two members of the back wall are formed at an angle therebetween of approximately 135°.

4. The wafer carrier of claim 1, wherein the lower wall is slightly slanted so that the second end of the lower wall is closer in distance to the ground than the first end of the lower wall.

5. The wafer carrier of claim 4, wherein the lower wall is slanted by approximately 1°.

6. The wafer carrier of claim 1, wherein the upper walls of the grooves are slanted by approximately 10°.

7. A semiconductor wafer carrier comprising:
   a base; and
   at least two walls mounted to the base, with a plurality of grooves for receiving wafers by lateral insertion thereinto through a mouth, the mouth defined by an upper wall and a substantially horizontal lower wall, wherein each groove comprises a closed end with a V-shape defined by a back wall joined to the upper wall and the lower wall so that the groove narrows from the mouth towards the closed end,
   wherein the upper wall is slanted upward towards the mouth, and
   a portion of the back wall that defines an upper side of the V-shape is joined to the upper wall and slants away from the mouth when going from the upper wall towards the lower wall.

8. The wafer carrier of claim 7, wherein another portion of the back wall that defines a lower side of the V-shape is joined to the lower wall and slants away from the mouth when going from the lower wall towards the upper wall.

9. A semiconductor wafer carrier comprising:

a base; and at least two vertical side walls mounted to the base, wherein each vertical side wall comprises a plurality of symmetrically formed horizontal grooves for receiving semiconductor wafers by lateral insertion thereinto through a mouth of each groove, each groove comprising:

- a lower wall with a first end and a second end at the mouth of the groove, the lower wall being substantially horizontal so that a wafer resting on the lower wall is substantially horizontal;
- an upper wall with a first end and a second end at the mouth of the groove; and
- a back wall having upper and lower members joined together to form a closed end, the groove narrowing from the mouth towards the closed end,
- wherein the upper and lower members of the back wall join at a point that is a greater distance from the mouth of the groove than both the first end of the lower wall and the first end of the upper wall.

10. The wafer carrier of claim 9, wherein the upper member of the back wall is joined to the first end of the upper wall and slants away from the mouth when going from the upper wall towards the lower wall.

11. The wafer carrier of claim 10, wherein the lower member of the back wall is joined to the first end of the lower wall and slants away from the mouth when going from the lower wall towards the upper wall.

* * * * *